(12) United States Patent
Huyett et al.

(10) Patent No.: US 10,201,110 B1
(45) Date of Patent: Feb. 5, 2019

(54) DEVICE RACK INCORPORATING MULTIPLE MOUNTING PLANES

(71) Applicant: Lockheed Martin Corporation, Bethesda, MD (US)

(72) Inventors: David A. Huyett, Casselberry, FL (US); Bryan M. Gessner, Orlando, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 666 days.

(21) Appl. No.: 14/183,611

(22) Filed: Feb. 19, 2014

(51) Int. Cl.
H05K 7/18 (2006.01)

(52) U.S. Cl.
CPC ............... *H05K 7/18* (2013.01); *H05K 7/186* (2013.01)

(58) Field of Classification Search
CPC .......... H05K 7/18; H05K 7/183; H05K 7/186
USPC ................... 211/26, 26.2, 41.17, 41.12, 183; 361/679.37
See application file for complete search history.

(56) References Cited

U.S. PATENT DOCUMENTS

| | | | | |
|---|---|---|---|---|
| 3,218,518 A | * | 11/1965 | Ashbridge et al. | 361/732 |
| 4,327,835 A | * | 5/1982 | Leger | 211/41.17 |
| 5,044,506 A | * | 9/1991 | Brown | 211/41.17 |
| 5,267,658 A | * | 12/1993 | Schwenk et al. | 211/26 |
| 5,298,681 A | * | 3/1994 | Swift et al. | 174/97 |
| 5,761,797 A | * | 6/1998 | Besserer et al. | 29/825 |
| 6,065,614 A | * | 5/2000 | Gunther et al. | 211/41.17 |
| 6,122,173 A | * | 9/2000 | Felcman et al. | 361/726 |
| 6,270,281 B1 | * | 8/2001 | Ruusuvuori | 403/11 |
| 6,469,899 B2 | | 10/2002 | Hastings et al. | |
| 6,474,479 B2 | * | 11/2002 | Kurrer et al. | 211/41.17 |
| 6,516,954 B2 | | 2/2003 | Broome | |
| 6,948,691 B2 | | 9/2005 | Brock et al. | |
| 7,529,097 B2 | | 5/2009 | Coglitore et al. | |
| 7,984,954 B2 | * | 7/2011 | Hightower | 312/249.4 |
| 8,089,752 B2 | * | 1/2012 | Xu et al. | 361/679.33 |
| 8,235,225 B2 | * | 8/2012 | Ye | 211/41.12 |
| 8,456,844 B2 | | 6/2013 | Chou et al. | |
| 8,800,787 B2 | * | 8/2014 | Lohman | 211/26 |
| 8,913,393 B2 | * | 12/2014 | Mimlitch et al. | 361/724 |
| 2005/0024842 A1 | | 2/2005 | Warenczak | |
| 2007/0146832 A1 | * | 6/2007 | Nakayama | 358/520 |
| 2009/0071916 A1 | * | 3/2009 | Becklin | 211/26 |
| 2010/0328872 A1 | * | 12/2010 | Chou et al. | 361/679.08 |
| 2011/0096491 A1 | * | 4/2011 | Liu | 361/679.33 |

(Continued)

OTHER PUBLICATIONS

Author Unknown, "Cabinets, Racks, Panels, and Associated Equipment," EIA/ECA-310-E, Dec. 2005, Electronics Industries Alliance, 24 pages

*Primary Examiner* — Stanton L Krycinski
(74) *Attorney, Agent, or Firm* — Withrow & Terranova, PLLC (57) ABSTRACT

A device rack is disclosed. The device rack includes a first side panel and a second side panel that collectively define an interior volume. Attachment mechanisms associated with the first side panel are configured to facilitate attachment of first rack-mount extensions of respective devices with respect to the first side panel at different selected mounting planes within the interior volume. Attachment mechanisms associated with the second side panel are configured to facilitate attachment of second rack-mount extensions of the respective devices with respect to the second side panel at the different selected mounting planes.

15 Claims, 5 Drawing Sheets

(56) References Cited

U.S. PATENT DOCUMENTS

2011/0149508 A1    6/2011  Malekmadani
2012/0152867 A1*   6/2012  Ye .................................. 211/26
2013/0091689 A1*   4/2013  Mimlitch et al. .......... 29/525.01

* cited by examiner

DEVICE RACK INCORPORATING MULTIPLE MOUNTING PLANES

GOVERNMENT RIGHTS

This invention was made with government support under contract N00019-02-C-3002 awarded by NAVAIR. The government has certain rights in the invention.

TECHNICAL FIELD

The embodiments relate to racks for housing data processing devices, and in particular, to a device rack that implements multiple mounting planes.

BACKGROUND

Data processing devices, such as network switches, routers, and computer servers that are used to provide services to an entity are often located in close proximity to one another to facilitate interconnections, to secure the devices, for cooling purposes, and the like. Such devices are frequently mounted in a stacked configuration in a device rack. Commercial data processing devices often adhere to certain uniform size standards, such as the Electronic Industries Alliance (EIA) 310 (EIA-310) size standards, to facilitate the mounting of different devices from different manufacturers in the same rack.

Data processing devices that adhere to the EIA-310 size standards include brackets or planar extensions that extend the width of the front panel of the device several inches beyond the width of the housing of the device. The extensions contain one or more openings positioned such that the openings in the extensions can be aligned with openings in vertical support columns of the device rack. Fasteners, such as bolts or screws, can then be passed through the openings in the extensions and into the openings in the vertical support columns to fix or otherwise mount the device with respect to the device rack.

There are several problems with conventional device racks. One problem is that each device is essentially housed in the same mounting plane. This is because the faces of the two vertical support columns of the device rack to which the devices are mounted are in a single plane. Because data processing equipment varies greatly in weight as well as in depth, this may result in an unbalanced device rack, which, in a mobile environment, or an environment exposed to substantial vibrations, such as might be found in military applications, may be problematic. Mounting each device in the same mounting plane may also result in a substantial amount of unused space in the device rack since each device necessarily takes up the complete horizontal slot in which the device is housed, irrespective of the depth of the device.

SUMMARY

The embodiments relate to a device rack, sometimes referred to as an equipment rack or computer rack that allows data processing devices to be mounted at different mounting planes within the device rack. In one embodiment, the device rack includes a first side panel and a second side panel that collectively define an interior volume. A first plurality of attachment mechanisms that are associated with the first side panel are configured to facilitate attachment of first rack-mount extensions of devices with respect to the first side panel at selected mounting planes of a plurality of predetermined mounting planes within the interior volume. A second plurality of attachment mechanisms that are associated with the second side panel are configured to facilitate attachment of second rack-mount extensions of the devices with respect to the second side panel at the selected mounting planes.

Among other advantages, the embodiments allow multiple different devices to be mounted in the device rack at any selected mounting plane. This, in turn, allows center-of-mass positioning to balance vibrations, allows commercial off-the-shelf (COTS) devices to be easily configured or replaced, and allows for more efficient utilization of space within the interior volume. Center-of-mass balancing can be relatively important in a number of mobile applications, such as where devices are utilized on a ship and on ground vehicles, such as military vehicles, telecommunication repair vehicles, and the like.

In one embodiment, the attachment mechanisms include a plurality of openings formed in the first side panel, and a plurality of mounting blocks. The mounting blocks are configured to detachably engage the first side panel at an opening formed at a desired device-mount location in the first side panel, and to detachably engage the first rack-mount extension of the device. The mounting blocks include a first face in which at least one mounting block opening is formed, and which is configured to be aligned with an opening of the plurality of openings formed in the first side panel at the desired device-mount location of the first side panel. The attachment mechanism may also include a first fastener configured to extend into the mounting block opening and the opening at the desired device-mount location to detachably attach the first mounting block to the first side panel.

In some embodiments, the first mounting block comprises a second face that is orthogonal to the first face. At least one hole formed in the second face is configured to be aligned with an opening in the first rack-mount extension. A second fastener is configured to extend into the at least one hole and the opening to detachably attach the first mounting block to the first rack-mount extension of the device.

In another embodiment, a device rack includes a first side panel and a second side panel that collectively define a front opening and an interior volume. The device rack includes at least one mounting block pair that includes a first mounting block that is configured to detachably engage the first side panel at any location of a plurality of different locations on the first side panel, wherein each location is a different distance from the front opening. The first mounting block is also configured to detachably engage a first rack-mount extension of a device. The at least one mounting block pair also includes a second mounting block that is configured to detachably engage the second side panel at a location on the second side panel that corresponds to the location on the first side panel to which the first mounting block is detachably engaged. The second mounting block is also configured to detachably engage a second rack-mount extension of the device.

In yet another embodiment, a device rack is provided that includes a first side panel and a second side panel that collectively define a front opening and an interior volume. The device rack includes a first plurality of attachment mechanisms associated with the first side panel that are configured to facilitate attachment of first rack-mount extensions of devices with respect to the first side panel at any of a plurality of different distances from the front opening. The device rack also includes a second plurality of attachment mechanisms associated with the second side panel that are configured to facilitate attachment of second rack-mount extensions of devices with respect to the second side panel at any of the plurality of different distances from the front opening.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The use herein of ordinals in conjunction with an element is solely for distinguishing what might otherwise be similar or identical labels, such as "first side panel" and "second side panel," and does not imply a priority, a type, an importance, or other attribute, unless otherwise stated herein. The word "line" as used herein means a formation in which elements, such as holes, are linearly arranged abreast of one another.

Figure 1:
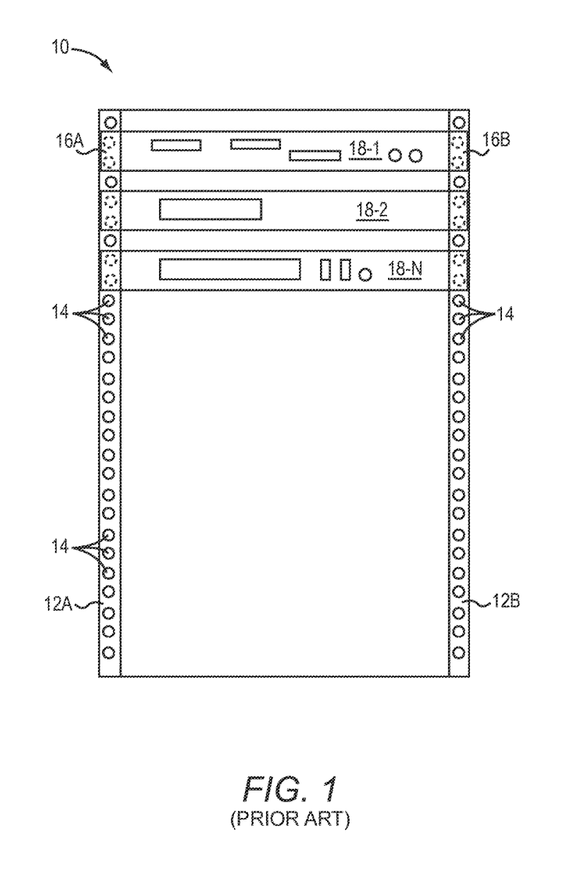
FIG. 1 is a front view of a conventional device rack.

FIG. 1 is a block diagram of a conventional device rack 10. The device rack 10 includes two attachment columns 12A, 12B, fixed with respect to side panels of the device rack 10, and located at the front of the device rack 10. The attachment columns 12A, 12B include a plurality of openings 14, only some of which are labeled for purposes of clarity. A first rack-mount extension 16A of a device 18-1 contains one or more openings that align with openings 14 on the attachment column 12A at a desired height. Fasteners (not illustrated), may be used to secure the first rack-mount extension 16A to the attachment column 12A. Similarly, a second rack-mount extension 16B of the device 18-1 contains one or more openings that align with openings 14 on the attachment column 12B at the desired height, and additional fasteners (not illustrated) may be used to secure the second rack-mount extension 16B to the attachment column 12B. In a similar manner, devices 18-2-18-N may also be mounted to the device rack 10. Because the faces of the attachment columns 12A, 12B to which the devices 18-1-18-N are mounted are in the same plane, each of the devices 18-1-18-N (generally, devices 18) are mounted in the same mounting plane.

Figure 2:
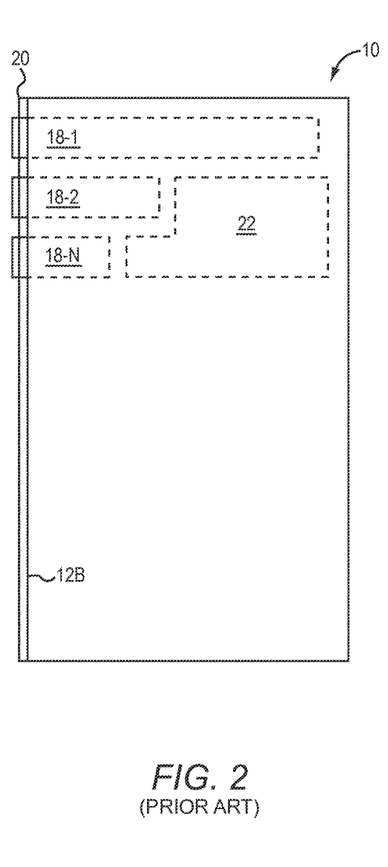
FIG. 2 is a side view of the conventional device rack illustrated in FIG. 1.

FIG. 2 is a side view of the device rack 10 illustrated in FIG. 1. Each of the devices 18 are mounted in the same mounting plane 20, even though each of the devices 18 has a different depth. This can result in wasted space 22, as well as an unbalanced device rack 10, which may be particularly problematic in a mobile environment, or an environment subject to substantial vibrations.

Figure 3:
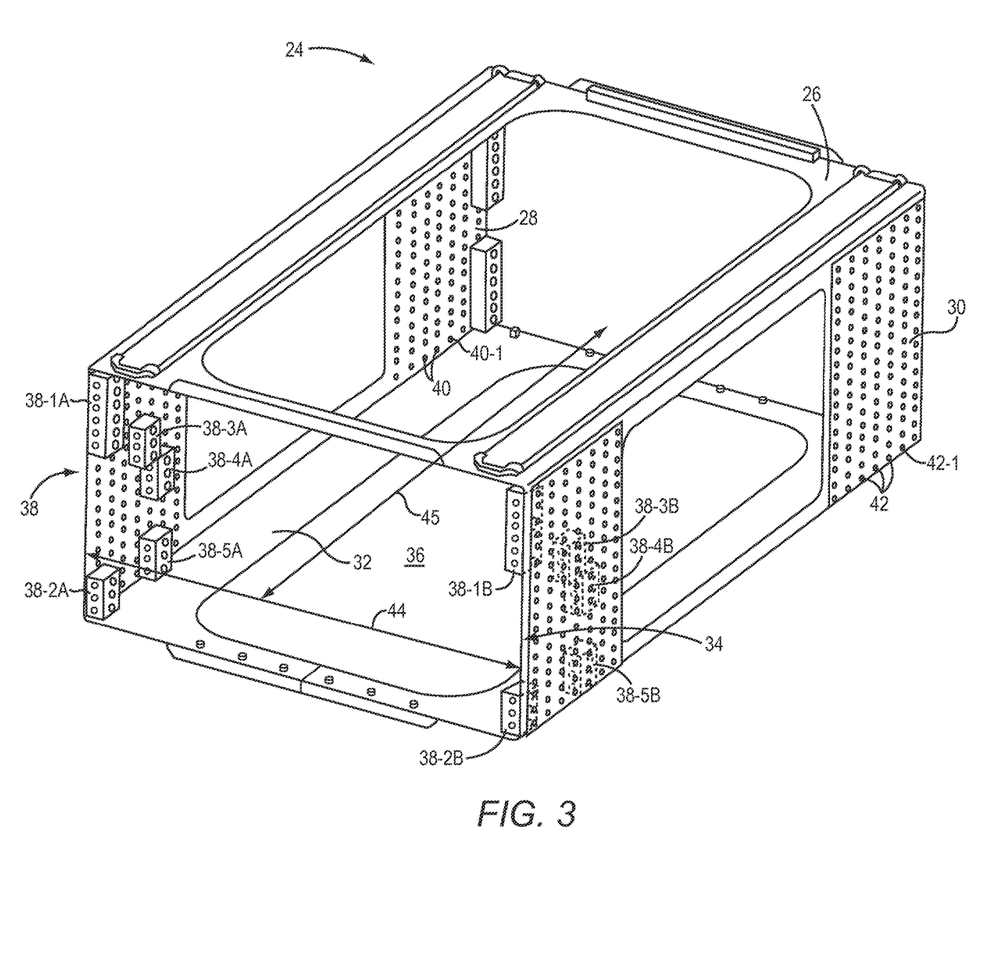
FIG. 3 is a perspective view of a device rack according to one embodiment.

FIG. 3 is a perspective view of a device rack 24 according to one embodiment. The device rack 24 includes a top cross-member 26, a first side panel 28, a second side panel 30, and a bottom cross-member 32. The first side panel 28 and the second side panel 30 collectively define a front opening 34 and an interior volume 36. A plurality of mounting blocks 38-1A-38-5A are associated with the first side panel 28. The mounting blocks 38-1A-38-5A are a type of attachment mechanism for facilitating attachment of the first rack-mount extensions 16A (FIG. 1) of the respective devices 18 with respect to the first side panel 28, according to one embodiment.

In one embodiment, a plurality of openings 40 are formed in the first side panel 28. The mounting blocks 38-1A-38-5A and the openings 40 facilitate attachment of the first rack-mount extensions 16A (FIG. 1) with respect to the first side panel 28 at any of a plurality of different distances from the front opening 34. Specifically, for example, the mounting block 38-A1 could be mounted at any column of the openings 40 in the first side panel 28 to position a respective device 18 at any desired distance from the front opening 34.

A plurality of openings 42 are formed in the second side panel 30. In some embodiments, the openings 42 correspond to the openings 40 in terms of height with respect to the bottom cross-member 32, and in terms of distance from the front opening 34. Thus, for example, an opening 42-1 corresponds to an opening 40-1 because the opening 42-1 is the same height from the bottom cross-member 32 as the opening 40-1, and is the same distance from the front opening 34.

The mounting blocks 38-1A-38-5A operate in pairs, and have corresponding mounting blocks 38-1B-38-5B that operate in conjunction with the openings 42 as a second plurality of attachment mechanisms configured to facilitate attachment of the second rack-mount extensions 16B with respect to the second side panel 30 at any of the plurality of different distances from the front opening 34. For example, the mounting blocks 38-1A and 38-1B operate as a pair of mounting blocks for facilitating attachment of a respective device 18 at any of a plurality of distances from the front opening 34. The mounting block pairs and openings 40, 42 are also configured to facilitate attachment of the respective first rack-mount extensions 16A and second rack-mount extensions 16B at any desired height within the interior volume 36.

In some embodiments, a width 44 of the front opening 34 defined by an interior face of the first side panel 28 and an interior face of the second side panel 30 is consistent throughout the entire depth 45 of the device rack 24, to facilitate insertion of a device 18 into the interior volume 36 of the device rack 24. In some embodiments, the width 44 is between about 19 inches and about 19.5 inches.

Figure 4:
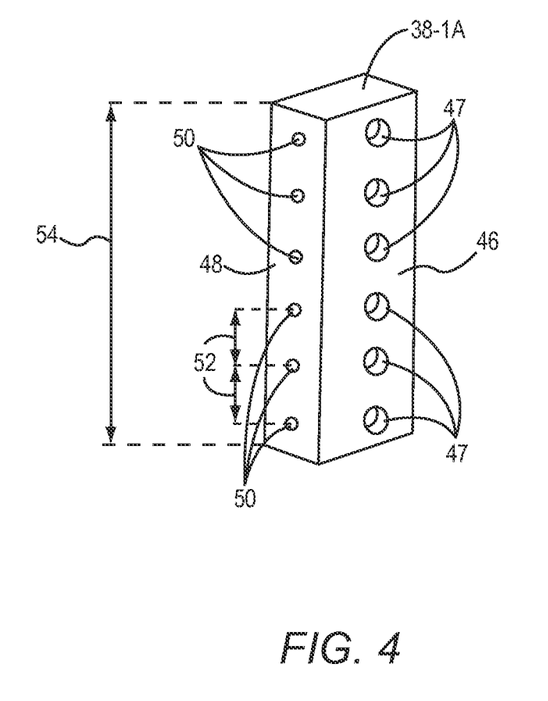
FIG. 4 is perspective view of a mounting block according to one embodiment.

FIG. 4 is a perspective view of the mounting block 38-1A according to one embodiment. The mounting block 38-1A includes a first face 46 that includes one or more openings 47. The openings 47, in one embodiment, are throughholes that extend completely through the mounting block 38-1A, and are sized to align with openings 40 in the first side panel 28 (FIG. 3). In one embodiment, the openings 47 may be countersunk to allow the head of a threaded fastener, such as a screw or a bolt, to be flush with or below the surface of the first face 46. In some embodiments, the openings 40, 42 in the side panels 28, 30 are threaded openings, and one or more threaded fasteners can be inserted into respective openings 47 of the mounting block 38-1A and thereby engage the threads of the aligned openings 40. The fasteners may then be tightened, thereby detachably fixing the mounting block 38-1A with respect to a desired location on the first side panel 28.

The mounting block 38-1A has a second face 48 that is substantially orthogonal to the first face 46. The second face 48 includes one or more holes 50 that are configured to be aligned with openings in the first rack-mount extension 16A. In some embodiments, the holes 50 are threaded, and a threaded fastener may be inserted into an opening in the first rack-mount extension 16A and into a hole 50, and then tightened to fix the first rack-mount extension 16A with respect to the mounting block 38-1A, and with respect to the first side panel 28.

In some embodiments, the holes 50 are spaced a distance from one another to conform with a desired standard, such as the EIA-310 size standard. In such embodiment, the centers of the holes 50 may be spaced a distance 52 of 0.625 inches apart from one another. For example, in some embodiments, the height 54 of the mounting block 38-1A may be based on a standard height of a device 18. In particular, the EIA-310 size standard defines standard heights of the devices 18 in terms of a rack unit (U) that is 1.75 inches high. Thus, in accordance with EIA-310 size standard parlance, a 1 U device 18 is 1.75 inches high, a 2 U device 18 is 3.50 inches high, a 3 U device is 5.25 inches high, and the like. Thus, the device rack 24 may use mounting blocks 38 of different heights 54 depending on the particular devices 18 being mounted. In order to mount a 1 U device 18 within the interior volume 36 of the device rack 24, a mounting block 38 that has a height 54 of 1.75 inches may be used. In order to mount a 2 U device 18 within the interior volume 36 of the device rack 24, a mounting block 38 that has a height 54 of 3.50 inches may be used. The mounting block 38-1A illustrated in FIG. 4 is a 2 U mounting block 38, and thus the height 54 is 3.50 inches. The mounting blocks 38-1B-38-5B may be configured substantially identically to the mounting blocks 38-1A-38-5A, as discussed herein, except the mounting blocks 38-1B-38-5B may be configured to align with the openings 42 formed in the second side panel 30. In some embodiments, the mounting blocks 38-1A-38-5A and the mounting blocks 38-1B-38-5B may be identical, and used with respect to either the first side panel 28 or the second side panel 30. In such embodiments, the openings 47 on the first face 46 may not be countersunk, or alternatively, the openings 47 may be countersunk both on the first face 46 and the opposing face through which the openings 47 extend.

Figure 5:
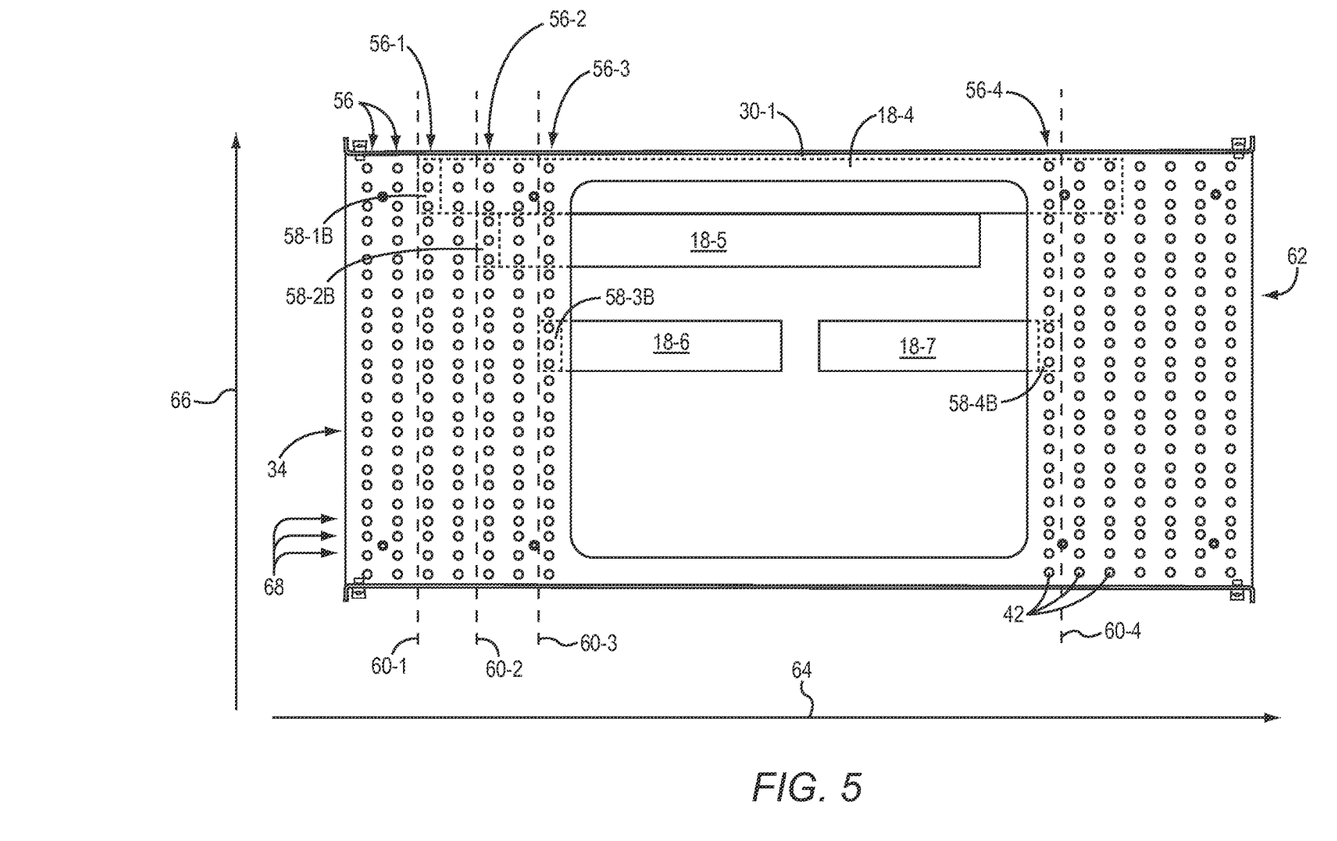
FIG. 5 is a diagram of a second side panel according to one embodiment.

FIG. 5 is a diagram of a second side panel 30-1 according to one embodiment. The second side panel 30-1 contains a plurality of columns 56, 56-1-56-4 (generally, columns 56) of openings 42 (sometimes referred to as mounting openings). Mounting blocks 58 may be mounted at any of the openings 42 in a desired column 56 to mount a device 18 at a desired height and in a desired mounting plane. For example, the mounting block 58-1B may be attached to the openings 42 in the column 56-1 at a desired height, and thereby mount a first device 18-4 at a mounting plane 60-1. The mounting block 58-2B may be attached to the openings 42 in the column 56-2 at a desired height, and thereby mount a second device 18-5 at the mounting plane 60-2. The mounting block 58-3B may be attached to the openings 42 in the column 56-3 at a desired height, and thereby mount a third device 18-6 at the mounting plane 60-3. The mounting block 58-4B may be attached to the openings 42 in the column 56-4 at the same height as that of the mounting block 58-3B, and thereby mount a fourth device 18-7 at the mounting plane 60-4. The fourth device 18-7 may be mounted with the front face of the fourth device 18-7 facing a rear opening 62 of the device rack 24, as illustrated.

The second side panel 30-1 has an X-dimension 64, and a Y-dimension 66, which is perpendicular to the X-dimension 64. Sets, or rows, 68 of the openings 42 are spaced apart in the Y-dimension 66, and define different heights at which a device 18 may be mounted. A corresponding first side panel 28 (not illustrated) has corresponding columns of openings 40 that are located the same distances from the front opening 34 as the columns 56, and has corresponding sets 68 of openings 40 that are located at the same heights as the rows 68, to allow a device 18 to be mounted at a desired height, and at the desired mounting plane 60.

Figure 6:
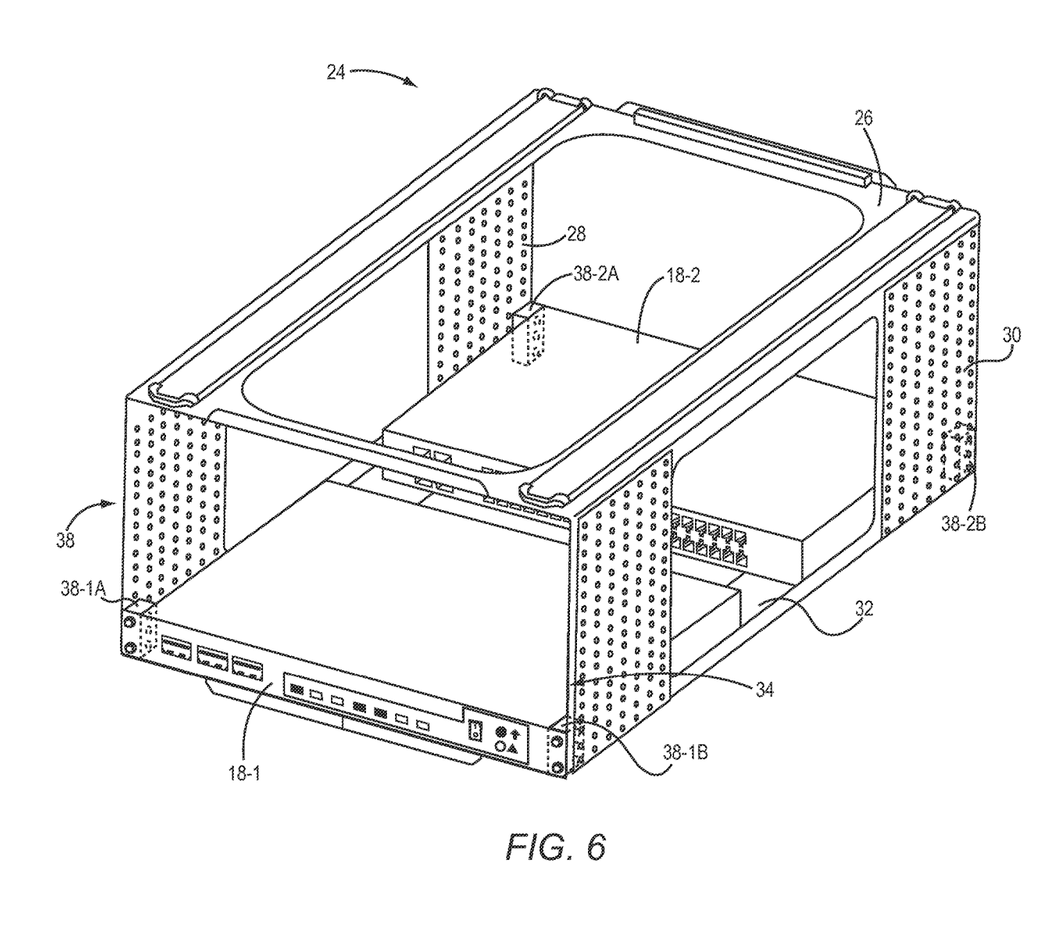
FIG. 6 is another perspective view of the device rack illustrated in FIG. 3.

FIG. 6 is another perspective view of the device rack 24 illustrated in FIG. 3. In this embodiment, the device 18-1 and the device 18-2 are mounted at the same height within the device rack 24, but at two different mounting planes 60. The device 18-1 is mounted using the mounting blocks 38-1A and 38-1B. The device 18-2 is mounted using the mounting blocks 38-2A and 38-2B. As illustrated, mounting the devices 18-1, 18-2 at the same height within the device rack 24 reduces wasted space 22 within the device rack 24, and may better balance the device rack 24.

Those skilled in the art will recognize improvements and modifications to the preferred embodiments of the present disclosure. All such improvements and modifications are considered within the scope of the concepts disclosed herein and the claims that follow.

What is claimed is:

1. A device rack comprising:
   a first side panel and a second side panel that collectively define a front opening and an interior volume;
   a first plurality of attachment mechanisms associated with the first side panel configured to facilitate attachment of first rack-mount extensions of respective devices with respect to the first side panel at any of a plurality of different distances from the front opening,
   wherein the first plurality of attachment mechanisms comprises a plurality of first openings formed in the first side panel, and a plurality of first mounting blocks configured to detachably engage the first side panel at corresponding openings of said first plurality of openings formed at corresponding desired device-mount locations in the first side panel, and to detachably engage the first rack-mount extensions of the respective devices; and
   a second plurality of attachment mechanisms associated with the second side panel configured to facilitate attachment of second rack-mount extensions of the respective devices with respect to the second side panel at any of the plurality of different distances from the front opening,
   wherein the second plurality of attachment mechanisms comprise a plurality of second openings formed in the second side panel, and a plurality of second mounting blocks configured to detachably engage the second side panel at corresponding openings of said second plurality of openings formed at corresponding desired device-mount locations in the second side panel, and to detachably engage the second rack-mount extensions of the respective devices.

2. The device rack of claim 1, wherein the first plurality of attachment mechanisms are further configured to facilitate attachment of the first rack-mount extensions of the respective devices with respect to the first side panel at any of a plurality of different heights within the interior volume.

3. The device rack of claim 1, wherein each of the plurality of first mounting blocks comprises a first face in which at least one mounting block opening is formed, the at least one mounting block opening configured to be aligned with an opening of the first plurality of openings formed in the first side panel at the desired device-mount location of the first side panel; and further comprising a first fastener configured to extend into the at least one mounting block opening and the opening formed at the desired device-mount location to detachably attach the first mounting block to the first side panel.

4. The device rack of claim 3, wherein each mounting block of the plurality of first mounting blocks comprises a second face that is orthogonal to the first face and in which at least one hole has been formed, the at least one hole configured to be aligned with an opening in the first rack-mount extension; and further comprising a second fastener configured to extend into the at least one hole and the opening to detachably attach the first mounting block to the first rack-mount extension of a respective device.

5. The device rack of claim 4, wherein the second face comprises three holes arranged in a line, and a center of each hole is 0.625 inches from a center of one of the other holes of the three holes.

6. The device rack of claim 5, wherein the first face comprises a plurality of mounting block openings, the plurality of mounting block openings configured to be aligned with a corresponding plurality of openings formed in the first side panel at the desired device-mount location of the first side panel; and further comprising a plurality of first fasteners configured to respectively extend into the plurality of mounting block openings and the corresponding plurality of openings in the first side panel to detachably attach the first mounting block to the first side panel.

7. A device rack comprising:
 a first side panel comprising:
  a first side panel x-dimension;
  a first side panel y-dimension that is perpendicular to the first side panel x-dimension; and
  a plurality of first sets of mounting openings, the mounting openings in each respective first set linearly spaced apart from one another in the first panel x-dimension; and
 a second side panel comprising:
  a second side panel x-dimension;
  a second side panel y-dimension that is perpendicular to the second side panel x-dimension; and
  a plurality of second sets of mounting openings, the mounting openings in each respective set linearly spaced apart from one in the second side panel x-dimension, wherein the first side panel and the second side panel collectively define a front opening and an interior volume; and
 a mounting block pair comprising:
  a first mounting block configured to detachably engage the first side panel at any of the plurality of first sets of mounting openings on the first side panel, and to detachably engage a first rack-mount extension of a device; and
  a second mounting block configured to detachably engage the second side panel at a second set of mounting openings of the plurality of second sets of mounting openings on the second side panel that corresponds to the any of the plurality of first sets of mounting openings on the first side panel, and to detachably engage a second rack-mount extension of the device.

8. The device rack of claim 7, wherein the first sets are spaced apart from one another in the first side panel y-dimension and the second sets are spaced apart from one another in the second side panel y-dimension, and each second set is at a corresponding location in the y-dimension as one of the first sets.

9. The device rack of claim 8, wherein the first mounting block comprises a first face in which at least one mounting block opening is formed, the at least one mounting block opening configured to be aligned with a mounting opening of the first sets of mounting openings in the first panel; and further comprising a first fastener configured to extend into the at least one mounting block opening and the mounting opening in the first panel to detachably attach the first mounting block to the first side panel.

10. The device rack of claim 9, wherein the first mounting block comprises a second face that is orthogonal to the first face and in which at least one hole has been formed, the at least one hole configured to be aligned with an opening in the first rack-mount extension; and further comprising a second fastener configured to extend into the at least one hole and the opening to detachably attach the first mounting block to the first rack-mount extension of the device.

11. The device rack of claim 10, wherein the second face comprises three holes arranged in a line, and a center of each hole is 0.625 inches from a center of one of the other holes of the three holes.

12. The device rack of claim 11, wherein the three holes are threaded.

13. The device rack of claim 7, wherein each first mounting block is configured to detachably engage the first side panel at any mounting opening in the plurality of first sets of mounting openings, and each second mounting block is configured to detachably engage the second side panel at any mounting opening in the plurality of second sets of mounting openings.

14. The device rack of claim 7, wherein the first side panel and the second side panel are parallel to one another, and a distance between the first side panel and the second side panel is constant along a plane that extends in the x-dimension and that is perpendicular to the first side panel.

15. The device rack of claim 14, wherein the distance is between about 19 inches and about 19.5 inches.

* * * * *